United States Patent
Kim

(10) Patent No.: US 10,790,859 B2
(45) Date of Patent: Sep. 29, 2020

(54) ERROR CORRECTION CIRCUIT AND OPERATING METHOD THEREOF

(71) Applicant: SK hynix Inc., Icheon-si (KR)

(72) Inventor: Jang Seob Kim, Seongnam-si (KR)

(73) Assignee: SKY hynix Inc., Icheon-si (KR)

( * ) Notice: Subject to any disclaimer, the term of this patent is extended or adjusted under 35 U.S.C. 154(b) by 0 days.

(21) Appl. No.: 16/366,944

(22) Filed: Mar. 27, 2019

(65) Prior Publication Data

US 2020/0099403 A1 Mar. 26, 2020

(30) Foreign Application Priority Data

Sep. 20, 2018 (KR) ........................ 10-2018-0113292

(51) Int. Cl.
*H03M 13/37* (2006.01)
*G06F 11/10* (2006.01)
*H03M 13/11* (2006.01)

(52) U.S. Cl.
CPC ..... *H03M 13/3746* (2013.01); *G06F 11/1076* (2013.01); *H03M 13/1102* (2013.01); *H03M 13/1105* (2013.01); *H03M 13/1108* (2013.01); *H03M 13/1142* (2013.01)

(58) Field of Classification Search
CPC ......... H03M 13/3746; H03M 13/1142; H03M 13/1102; H03M 13/1105; H03M 13/1108; G06F 11/1076
USPC ................ 714/764, 752, 763, 768, 786, 799
See application file for complete search history.

(56) References Cited

U.S. PATENT DOCUMENTS

| 8,196,016 B1 * | 6/2012 | Langner | H03M 13/11 714/758 |
| 8,316,272 B2 * | 11/2012 | Gunnam | H03M 13/1111 714/752 |
| 8,464,128 B2 * | 6/2013 | Gunnam | H03M 13/1111 714/752 |

(Continued)

FOREIGN PATENT DOCUMENTS

| KR | 10-2007-0053504 | 5/2007 |
| KR | 10-2008-0026559 | 3/2008 |
| KR | 10-0930240 | 12/2009 |

OTHER PUBLICATIONS

Kim, Trapping Set Error Correction through Adaptive Informed Dynamic Scheduling Decoding of LDPC Codes, Jul. 2012, IEEE, vol. 16, No. 7, pp. 1103-1105 (Year: 2012).*

(Continued)

*Primary Examiner* — John J Tabone, Jr.
(74) *Attorney, Agent, or Firm* — Perkins Coie LLP

(57) ABSTRACT

Disclosed are devices, systems and methods for error correction decoding using an iterative decoding scheme. An error correction circuit includes a node processor to perform a plurality of iterations for updating values of one or more variable nodes and one or more check nodes using initial values assigned to the one or more variable nodes, respectively, a trapping set detector to detect a trapping set in at least one of the plurality of iterations by applying a predetermined trapping set determination policy, and a post processor to reduce at least one of the initial values or invert at least one of values of the variable nodes corresponding to an iteration in which the trapping set is detected, upon detection of the trapping set.

15 Claims, 14 Drawing Sheets

(56) References Cited

U.S. PATENT DOCUMENTS

| | | | | | |
|---|---|---|---|---|---|
| 8,677,227 | B2* | 3/2014 | Gross | ................. | H03M 13/1117 714/807 |
| 8,689,074 | B1* | 4/2014 | Tai | ...................... | H03M 13/112 714/24 |
| 8,689,084 | B1* | 4/2014 | Tai | ...................... | H03M 13/112 714/24 |
| 8,996,971 | B2* | 3/2015 | Zhang | ............... | H03M 13/1142 714/800 |
| 9,459,956 | B2* | 10/2016 | Hubris | ................ | G06F 11/1048 |
| 9,793,923 | B2* | 10/2017 | Tao | ................... | H03M 13/1117 |
| 2010/0042904 | A1* | 2/2010 | Gunnam | ........... | H03M 13/3707 714/780 |
| 2010/0042906 | A1* | 2/2010 | Gunnam | ........... | H03M 13/1111 714/780 |
| 2011/0231731 | A1* | 9/2011 | Gross | ................. | H03M 13/658 714/760 |
| 2011/0264979 | A1* | 10/2011 | Gunnam | ........... | H03M 13/1128 714/752 |
| 2011/0320902 | A1* | 12/2011 | Gunnam | ........... | H03M 13/1128 714/752 |
| 2012/0005551 | A1* | 1/2012 | Gunnam | ........... | H03M 13/6306 714/752 |
| 2013/0343495 | A1* | 12/2013 | Han | .................. | H03M 13/6331 375/341 |
| 2013/0346824 | A1* | 12/2013 | Bolotov | ............ | H03M 13/2957 714/755 |
| 2014/0068367 | A1* | 3/2014 | Zhang | ............... | H03M 13/2957 714/752 |
| 2014/0068368 | A1* | 3/2014 | Zhang | ................ | H03M 13/658 714/752 |
| 2015/0365106 | A1 | 12/2015 | Wu et al. | | |
| 2016/0197624 | A1 | 7/2016 | Wang et al. | | |
| 2017/0149446 | A1* | 5/2017 | Tao | ................... | H03M 13/1117 |
| 2018/0323807 | A1* | 11/2018 | Ahn | ................... | H03M 13/1111 |
| 2018/0375611 | A1* | 12/2018 | Myung | ................. | H04L 1/0045 |
| 2019/0334549 | A1* | 10/2019 | Kim | ................... | H03M 13/1575 |
| 2020/0014408 | A1* | 1/2020 | Kim | ................... | H03M 13/1111 |
| 2020/0119751 | A1* | 4/2020 | Kim | ................... | H03M 13/1128 |

OTHER PUBLICATIONS

Kang et al., Breaking the Trapping Sets in LDPC Codes: Check Node Removal and Collaborative Decoding, Jan. 2016, IEEE, vol. 64, No. 1, pp. 15-26. (Year: 2016).*

Kim, Adaptive Mixed Scheduling for Correcting Errors in Trapping Sets of LDPC Codes, Jul. 2010, IEEE, vol. 14, No. 7, pp. 664-666. (Year: 2010).*

* cited by examiner

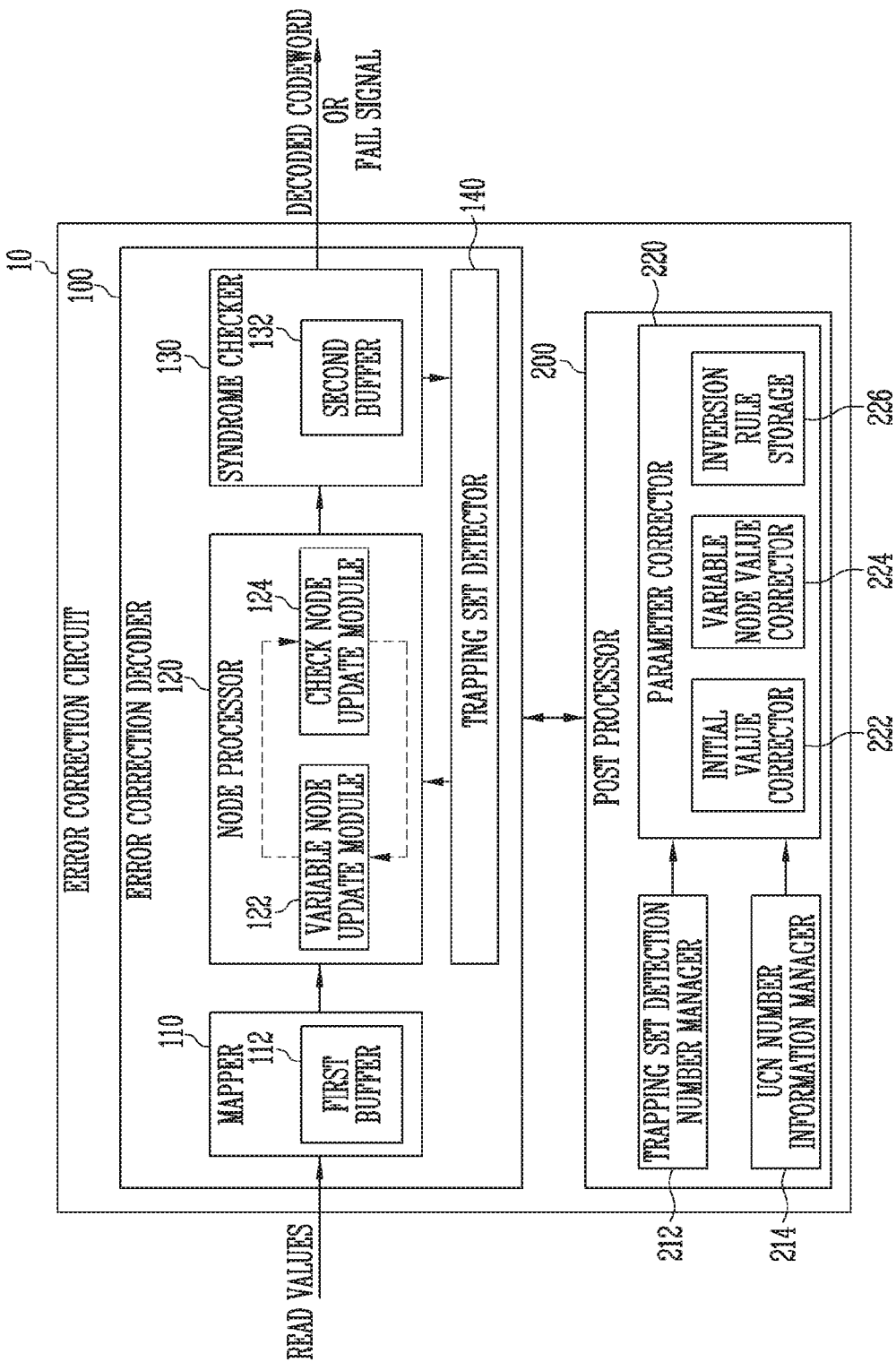

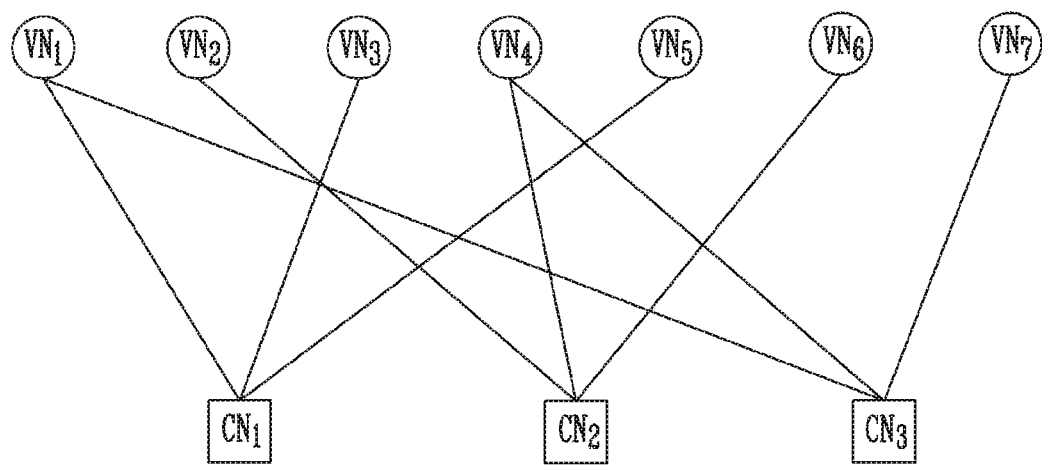

FIG. 5

$$\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix} \times \begin{bmatrix} C_{i1} \\ C_{i2} \\ C_{i3} \\ \vdots \\ C_{i7} \end{bmatrix} = \begin{bmatrix} S_{i1} \\ S_{i2} \\ S_{i3} \end{bmatrix}$$

$$H \qquad\qquad C_i^T \qquad\qquad S_i$$

FIG. 7

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | -4 | +4 | | | | | | |
| 3 | -4 | -2 | +4 | | | | | |
| 4 | -4 | -2 | +2 | +4 | | | | |
| 5 | -4 | -3 | -2 | +2 | +4 | | | |
| 6 | -4 | -3 | -2 | -1 | +2 | +4 | | |
| 7 | -4 | -3 | -2 | -1 | +1 | +2 | +4 | |
| 8 | -4 | -3 | -2 | -1 | +1 | +2 | +3 | +4 |

FIG. 10

| VARIABLE NODE | VN$_1$ | VN$_2$ | VN$_3$ | VN$_4$ |
|---|---|---|---|---|
| INITIAL VALUE | 3 | 2 | 1 | -2 |
| INITIAL VALUE CORRECTED WHEN FIRST TRAPPING SET OCCURS | 3 | 1 | 0 | -1 |
| INITIAL VALUE CORRECTED WHEN SECOND TRAPPING SET OCCURS | 3 | 0 | 0 | 0 |

FIG. 11

| VARIABLE NODE | VN$_1$ | VN$_2$ | VN$_3$ | VN$_4$ |
|---|---|---|---|---|
| INITIAL VALUE | 3 | 2 | 2 | -2 |
| NUMBER OF UCNs WHEN FIRST TRAPPING SET OCCURS | 3 | 2 | 1 | 2 |
| INITIAL VALUE CORRECTED WHEN FIRST TRAPPING SET OCCURS | 3 | 0 | 1 | 0 |

ERROR CORRECTION CIRCUIT AND OPERATING METHOD THEREOF

CROSS-REFERENCE TO RELATED APPLICATION

This patent document claims priority to the Korean patent application number 10-2018-0113292 filed on Sep. 20, 2018, which is incorporated herein by reference in its entirety for all purposes.

TECHNICAL FIELD

The technology and implementations disclosed in this patent document generally relate to an error correction circuit and an operating method thereof.

BACKGROUND

A memory system may include a storage media that stores data on memory devices therein either temporarily or persistently. In order to control errors in data that could have occurred as a result of interferences between adjacent memory cells or any data corruption occurring during writing, reading, transmission, or processing, the memory system may use error correction techniques such as error correction coding and decoding to ensure data reliability. The error correction techniques may be implemented in the form of hardware and/or software. For example, circuitry for error correction may perform encoding and decoding in the memory system using an error-correction code.

A low density parity check (LDPC) code has performance exceeding other traditional error correction code techniques and has been widely used in communication and other systems. With its iterative decoding scheme, the LDPC coding may improve error correction performance (e.g., error correction capability per bit) as the code length is increased, without increasing computational complexity per bit.

SUMMARY

The technology disclosed in this patent document can be implemented in various embodiments to provide an error correction circuit that, among other features and benefits, is capable of solving issues that occur due to a trapping set when the trapping set is detected during iterative decoding.

An embodiment of the disclosed technology may provide for an error correction circuit to perform error correction decoding using an iterative decoding scheme, the error correction circuit may include a node processor to perform a plurality of iterations to update values of one or more variable nodes and one or more check nodes using initial values assigned to the one or more variable nodes, respectively, a trapping set detector to detect a trapping set in at least one of the plurality of iterations by applying a predetermined trapping set determination policy, and a post processor to reduce at least one of the initial values or invert at least one of values of the variable nodes corresponding to an iteration in which the trapping set is detected, upon detection of the trapping set.

An embodiment of the disclosed technology may provide for an operating method of an error correction circuit, the error correction circuit performing error correction decoding using an iterative decoding scheme. The operating method may include performing a plurality of iterations for updating values of one or more variable nodes and one or more check nodes using initial values assigned to a plurality of variable nodes, respectively, detecting a trapping set in at least one of the plurality of iterations by applying a predetermined trapping set determination policy, and reducing at least one of the initial values or inverting at least one of values of the variable nodes in correspond to an iteration in which the trapping set is detected, upon detection of the trapping set.

An embodiment of the disclosed technology may provide for an error correction circuit performing error correction decoding according to an iterative decoding scheme, the error correction circuit may include a node processor performing a plurality of iterations using initial values assigned to a plurality of variable nodes, respectively, a trapping set detector detecting a trapping set in at least one of the plurality of iterations by applying a predetermined trapping set determination policy, and a post processor reducing at least one of the initial values or inverting at least one of values of the variable nodes corresponding to an ith iteration, among the plurality of iterations, when the trapping set is detected in the ith iteration.

An embodiment of the disclosed technology may provide for an operating method of an error correction circuit, the error correction circuit performing error correction decoding according to an iterative decoding scheme. The operating method may include performing a plurality of iterations using initial values assigned to a plurality of variable nodes, respectively, detecting a trapping set in at least one of the plurality of iterations by applying a predetermined trapping set determination policy, and reducing at least one of the initial values or inverting at least one of values of the variable nodes in correspond to an ith iteration, among the plurality of iterations, when the trapping set is detected in the ith iteration.

BRIEF DESCRIPTION OF THE DRAWINGS

FIG. 2 is a diagram illustrating an example of an error correction circuit based on an embodiment of the disclosed technology.

FIG. 3 is a diagram illustrating an example of a parity check matrix.

FIG. 4 is a Tanner graph of a parity check matrix of FIG. 3.

FIG. 5 is a diagram illustrating an example of a syndrome vector calculated using a parity check matrix of FIG. 3.

FIG. 7 is a diagram illustrating an example of a lookup table.

FIG. 10 is a diagram illustrating an example of an initial value correction method based on an embodiment of the disclosed technology.

FIG. 11 is a diagram illustrating an example of an initial value correction method based on another embodiment of the disclosed technology.

DETAILED DESCRIPTION

The technology disclosed in this patent document can be implemented in embodiments to provide error correction circuits and methods that, among other features and benefits, are capable of correcting errors caused in-part due to a trapping set.

Figure 1:
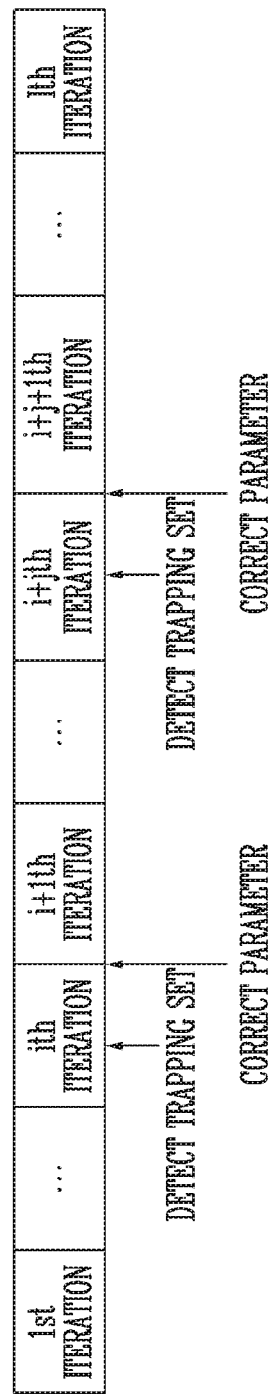
FIG. 1 is a diagram illustrating an error correction decoding method based on some embodiments of the disclosed technology.

FIG. 1 is a diagram illustrating an error correction decoding method based on some embodiments of the disclosed technology.

As noted earlier, LDPC codes are used in many applications, but one of the limitations in the LPDC codes occur due to trapping sets, which are nodes in a Tanner graph where specific low-weight error patterns cause the decoder to fail. During an error correction decoding process using an iterative decoding scheme, a trapping set hinders an error correction decoder from converging on a valid codeword. For example, where the error correction decoding process is performed for a finite number of iterations, it may be considered that a trapping set exists, for example, if there are no changes in messages during some of the entire iteration completes, or if, although there are some changes in the messages, a syndrome vector converges in a wrong direction. In general, it is known that when a trapping set exists, error correction is impossible even when numerous iterations are performed without further separate processing. In other words, when a trapping set exists, performing another iteration without further separate processing would result in waste of resources.

Where a trapping set is detected during error correction decoding using an iterative decoding scheme, some embodiments of the disclosed technology can provide significant performance improvement by using a corrected or modified parameter in performing the error correction decoding.

In some embodiments of the disclosed technology, iterative decoding may be performed for a finite number of iterations, which will be referred to as a maximum iteration number I. When a trapping set is detected during an ith iteration, an (i+1)th iteration may be performed using a corrected or modified parameter in performing the iterative decoding. In an embodiment, when a trapping set is detected during the ith iteration, the iterative decoding may re-start from the first iteration after correcting or modifying a parameter used for the iterative decoding. Here, "I" may be a natural number, and "i" may be a natural number less than I.

In some embodiments of the disclosed technology, a parameter may be corrected or modified whenever a trapping set is detected. For example, when a trapping set is detected during an ith iteration, an (i+1)th iteration may be performed using a corrected or modified parameter. When another trapping set is detected during an (i+j)th iteration, an (i+j+1)th iteration may be performed using another parameter which is further corrected or modified. Here, "j" is a natural number less than I and $i+j+1 \leq I$ may be satisfied.

In some embodiments of the disclosed technology, a parameter may include at least one of initial values corresponding to read values and values of variable nodes corresponding to the ith iteration.

FIG. 2 is a diagram illustrating an example of an error correction circuit 10 based on an embodiment of the disclosed technology.

Referring to FIG. 2, the error correction circuit 10 based on an embodiment of the disclosed technology include an error correction decoder 100 and a post processor 200.

The error correction decoder 100 may perform error correction decoding using various algorithms adopting an iterative decoding scheme. For example, the error correction decoder 100 may perform error correction decoding using a message passing algorithm (MPA), which is also referred to as a belief propagation algorithm (BPA).

The error correction decoder 100 may perform error correction decoding by an iterative decoding scheme for a predetermined finite number of iterations, which is referred to as "maximum iteration number." When a valid codeword that satisfies constraints of a parity check matrix of an error correction code (ECC) is generated within the predetermined maximum iteration number, the error correction decoder 100 may output the generated valid codeword as a decoded codeword. By contrast, the error correction decoder 100 may be configured to declare a decoding failure when for example, the valid codeword that satisfies the constraints of the parity check matrix of the error correction code is not generated after the maximum iteration number is reached. In this scenario, the error correction decoder 100 may output a "fail" signal indicating that error correction decoding has failed. The error correction decoder 100 may use a low density parity check (LDPC) code as an error correction code. In some implementations of the disclosed technology, the constraints of the parity check matrix may include a certain equation that must be satisfied to declare a decoding success.

The error correction decoder 100 may include a mapper 110, a node processor 120, a syndrome checker 130, and a trapping set detector 140. According to an embodiment, at least one of the mapper 110, the syndrome checker 130, and the trapping set detector 140 may exist outside the error correction decoder 100.

The mapper 110 may receive read values from a channel. Read values are values that are read from a memory device. For example, a single read operation conducted over a memory location or cell may produce a binary value of either zero or one in a binary storage scheme. For example, the mapper 110 may receive, from a memory device, read values corresponding to a codeword from the memory device. Each of the read values may be logic low ("0") or logic high ("1"). When hard-decision decoding is used, a single set of read values may correspond to a single codeword. The single set of read values may be referred to as a single read vector. When soft-decision decoding is used, a plurality of sets of read values may correspond to a single codeword. That is, when soft-decision decoding is used, a plurality of read vectors may correspond to a single codeword.

In some implementations, the channel may include a wired or wireless medium through which the read values are conveyed or a storage medium in which information is stored. In some implementations of the disclosed technology, the channel may include an interface that carries data between the error correction circuit 10 and a memory device, or may include the memory device itself. The read values may correspond to a codeword. For example, the codeword may be generated by adding parity bits to an original message during an error correction encoding.

The mapper 110 may generate quantized read values, using the read values. In some embodiments of the disclosed technology, the mapper 110 may generate a (g+1) level quantized read vector using g read vectors. Each read value included in the (g+1) level quantized read vector may be a (g+1) level quantized read value. The (g+1) level quantized read value may be a read pattern (e.g., a bit sequence) configured with g bits. For example, a 2-level quantized read value may be "1" or "0." Here, for example, one of the 2-level quantized read values may be "1," and the other of the 2-level quantized read values may be "0." As another example, a 3-level quantized read value may be "11," "10," "01" or "00." For example, one of the 3-level quantized read values may be "11," another of the 3-level quantized read values may be "00," and the rest of the 3-level quantized read values may be "10" or "01."

When the soft decision decoding is used (e.g., g is 2 or more), the mapper 110 may generate a (g+1) level quantized read vector by combining read vectors corresponding to g read voltages. For example, when two read voltages (e.g., a first read voltage and a second read voltage) are used, the mapper 110 may generate a 3-level quantized read vector by combining a read vector corresponding to the first read voltage and a read vector corresponding to the second read voltage. To this end, the mapper 110 may include a first buffer 112. When g read voltages are used, the first buffer 112 may receive and store read vectors respectively corresponding to the g read voltages. The mapper 110 may generate a (g+1) level quantized read vector by combining the read vectors stored in the first buffer 112, corresponding to the g read voltages.

When hard decision decoding is used (e.g., g is 1), the mapper 110 may determine that one read vector itself is a 2-level quantized read vector.

The mapper 110 may convert the (g+1) level quantized read vector (the read vector quantized into g+1levels) to an initial vector to be used in error correction decoding according to an iterative decoding scheme, and may provide the initial vector to at least one of the node processor 120 and the post processor 200. The initial vector may include a plurality of initial values. That is, the mapper 110 may convert each of the (g+1) level quantized read values to an initial value. The initial values may be, for example, a log likelihood ratio (LLR) values.

The node processor 120 may perform error correction decoding based on the initial vector received from the mapper 110 within the maximum iteration number. The node processor 120 may perform error correction decoding using various algorithms adopting an iterative decoding scheme. For example, the node processor 120 may perform error correction decoding using a message passing algorithm (MPA). By the way of example and not by limitation, as the message passing algorithm (MPA), a sum-product algorithm, a minimum (min)-sum algorithm or others may be used.

In an example implementation of the MPA, messages in the form of probability vectors are passed among nodes in a graph where the iteration of the algorithm may be viewed as messages passing through the graph. The MPA may generate an output converging to a correct estimate of the read values through iterations of exchange of messages between variable nodes and check nodes. The message may include a variable to check (V2C) message transmitted from a variable node to a check node and a check to variable (C2V) message transmitted from a check node to a variable node. A combination of processes including a process of transmitting V2C messages from the variable nodes to the check nodes, a process of transmitting C2V messages from the check nodes to the variable nodes, and a process of updating values of the respective nodes through the respective processes may be referred to as one iteration.

The node processor 120 may include a variable node update module 122 and a check node update module 124.

Before a first iteration is performed, the variable node update module 122 may initialize the variable nodes, using the initial vector (e.g., LLR values) received from the mapper 110. For example, the variable node update module 122 may allocate initial values included in the initial vector to the respective variable nodes. In the first iteration, the variable node update module 122 may generate and transmit V2C messages to the check node update module 124 such that the initial value of each of the variable nodes is transferred to a check node connected to the corresponding variable node. In each iteration, the variable node update module 122 may update values of the variable nodes, based on C2V messages received from the check node update module 124. In some embodiments, the variable node update module 122 may update the values of the variable nodes by further considering the initial values corresponding to the variable nodes. The values of the variable nodes may be a posteriori probabilities (APPs) of the variable nodes. In each of the iterations except the first iteration, the variable node update module 122 may generate V2C messages, based on the C2V messages received from the check node update module 124, and transmit the generated V2C messages to the check node update module 124. In some embodiments, the variable node update module 122 may generate the V2C messages by further considering the initial values corresponding to the variable nodes.

In each iteration, the check node update module 124 may update values of the check nodes, based on the V2C messages received from the variable node update module 122. In each iteration, the check node update module 124 may generate C2V messages, based on the V2C messages received from the variable node update module 122, and transmit the generated C2V messages to the variable node update module 122.

The initial values and the messages may be referred to as soft information. The soft information may include values expressed by an integer or real number. In an example implementation, the soft information may be a Log Likelihood Ratio (LLR) value. The soft information may include estimates of probability or some equivalent information representing that an estimate of each symbol belonging to a codeword is "0" or "1" and a confidence value (probability or likelihood) of each estimate. For example, the soft information may include a sign bit and a magnitude bit. The sign bit may represent an estimate of the corresponding symbol. For example, a sign bit representing a negative value may indicate that it is more likely that the corresponding symbol will be "1," and a sign bit representing a positive value makes it less likely that the corresponding symbol is "1." On the contrary, the sign bit representing the positive value may indicate that it is more likely that the corresponding symbol will be "0," and the sign bit representing the negative value makes it less likely that the corresponding symbol is "0." The magnitude bit may represent a confidence value (probability or likelihood) with respect to the sign bit. For example, when the value of the magnitude bit increases, the confidence value (probability or likelihood) with respect to the sign bit may increase.

The node processor 120 may repeat the iterations within the maximum iteration number I and provide the syndrome checker 130 with hard decision values of variable nodes (hereinafter, hard decision vector $C_i$) corresponding to a result of performing an ith iteration. The hard decision values of the variable nodes may correspond to the APPs of the variable nodes. Here, "I" may be a natural number and "i" may be a natural number less than or equal to I. Although the hard decision vector may be either a row vector or a column vector, it is assumed in the examples below that the hard decision vector is a row vector.

When a valid codeword that satisfies constraints of a parity check matrix of an error correction code is generated within the maximum iteration number I, the syndrome checker 130 may output the valid codeword as a decoded codeword. For example, the syndrome checker 130 may store the hard decision vector $C_i$, which is received from the node processor 120 at the ith iteration, in a second buffer 132 and may perform a syndrome check on the received hard decision vector $C_i$. For example, the syndrome check may be performed by checking whether all entries of a syndrome vector $S_i$ calculated by the following Equation 1 are '0'. The syndrome vector $S_i$ can be expressed as:

$$S_i = H \cdot C_i^T \qquad \text{[Equation 1]}$$

where $S_i$ denotes a syndrome vector corresponding to an ith iteration, H denotes a parity check matrix of an error correction code, and $C_i^T$ denotes a transpose of a hard decision vector $C_i$ corresponding to the ith iteration.

In a case where all entries of the syndrome vector $S_i$ are "0," it can be determined that the syndrome vector has passed the syndrome check. This means that error correction decoding has been successfully performed in the ith iteration. Thus, the syndrome checker 130 may output the hard decision vector $C_i$ which is stored in the second buffer 132, as a decoded codeword.

On the other hand, in a case where there is at least one nonzero entry among the entries of the syndrome vector $S_i$, it can be determined that the syndrome check has failed. This means that error correction decoding has failed in the ith iteration. Therefore, the node processor 120 may perform an (i+1)th iteration as long as the maximum iteration number I has not been reached. A check node corresponding to a nonzero entry, among the entries of the syndrome vector $S_i$, may be referred to as an unsatisfied check node (UCN). When the syndrome check corresponding to the ith iteration fails, the syndrome checker 130 may notify the trapping set detector 140 of the failure of the ith iteration. The syndrome checker 130 may provide the trapping set detector 140 with at least one of the syndrome vector and information about the number of unsatisfied check nodes (UCNs) corresponding to the ith iteration.

The trapping set detector 140 may confirm whether a trapping set exists in the current iteration according to a predetermined trapping set determination policy. For example, the trapping set detector 140 may detect a trapping set by checking whether the syndrome vector or the information about the number of UCNs received from the syndrome checker 130 satisfies the predetermined trapping set determination policy. For example, the trapping set detector 140 may determine that a trapping set exists when the number of UCNs in the current iteration is greater than a predetermined number. For example, the trapping set detector 140 may determine that a trapping set exists when the number of UCNs is greater in the current iteration than in the previous iteration. The trapping set detector 140 may store a syndrome check history. The syndrome check history may include a syndrome vector or information about the number of UCNs corresponding to a predetermined number of iterations. In addition, the trapping set detector 140 may detect a trapping set using various trapping set determination policies. When a trapping set is detected before the maximum iteration number is reached, the trapping set detector 140 may cause the node processor 120 not to perform another iteration, and thus iterative decoding on the current read values is stop. In addition, the trapping set detector 140 may notify the post processor 200 of the trapping set detected in the current iteration.

When the trapping set exists, the post processor 200 may support the error correction decoder 100 to generate a valid codeword. In some implementations, the post processor 200 may prevent the error correction decoder 100 from converging on the same trapping set as the previous trapping set. For example, when the post processor 200 is notified by the trapping set detector 140 that the trapping set is detected, the post processor 200 may correct or modify an initial value or a variable node value of the current iteration. The post processor 200 may control the error correction decoder 100 to perform further error correction decoding using a corrected or modified parameter (corrected or modified initial value or variable node value). Provided the iterative decoding has been stopped because of the trapping set, the error correction decoder 100 may resume the iterative decoding. In other words, the error correction decoder 100 may perform the next iteration using the corrected or modified parameter.

The post processor 200 may include a trapping set detection number manager 212, a UCN number information manager 214, and a parameter corrector 220.

The trapping set detection number manager 212 may manage information relating to the number of trapping sets detected during iterative decoding on the current read values. The trapping set detection number manager 212 may provide information about the number of detections of the trapping sets to at least one of an initial value corrector 222 and a variable node value corrector 224.

The UCN number information manager 214 may manage information about the number of UCNs coupled to each of the variable nodes in the current iteration. For example, the UCN number information manager 214 may check the number of UCNs coupled to each of the variable nodes in the current iteration on the basis of the parity check matrix used by the error correction decoder 100 and the syndrome vector received from the syndrome checker 130 or the trapping set detector 140. The UCN number information manager 214 may provide the information about the number of UCNs to at least one of the initial value corrector 222 and the variable node value corrector 224.

In some embodiments of the disclosed technology, when the sign (e.g., plus sign or minus sign) of the value of the variable node in the iteration where a trapping set occurs is not consistent with the sign of the initial value of the variable node, the UCN number information manager 214 may update the number of UCNs by increasing the number of UCNs by 1 (one). For example, in the iteration where a trapping set occurs, if the variable node has a negative (or positive) value and the initial value of the variable node has a positive (or negative) value, then the number of UCNs increases by 1 (one).

The parameter corrector 220 may correct or modify a parameter used in the iterative decoding and control the error correction decoder 100 to resume the error correction decoding using the corrected or modified parameter. The parameter corrector 220 may include at least one of the initial value corrector 222, the variable node value corrector 224, and an inversion rule storage 226. In an embodiment of the disclosed technology, the initial value corrector 222 and the variable node value corrector 224 may be selectively operated.

The initial value corrector 222 may correct or modify magnitudes of initial values, for example, LLR values.

In an embodiment of the disclosed technology, the initial value corrector 222 may reduce the initial values by the same magnitude when a trapping set is detected. For example, the initial value corrector 222 may reduce the magnitudes of all the initial values by the same magnitude, e.g., a first value. For example, the first value may be 1 (one). In this case, each of the initial values may maintain the original sign. In some implementations, the initial value corrector 222 does not correct or modify an initial value having a magnitude of zero.

In another embodiment of the disclosed technology, the initial value corrector 222 may selectively modify initial values, for example, by determining at least one of the initial values as a target initial value for correction or modification. For example, the initial value corrector 222 may determine initial values having magnitudes less than a predetermined value as target initial values for correction or modification and may correct or modify the target initial values only. In other words, the initial value corrector 222 may reduce the magnitudes of the initial values having the magnitude less than the predetermined value without reducing initial values having magnitudes greater than or equal to the predetermined value. For example, in a scenario where initial values are quantized into eight levels and each of the initial values has a magnitude of one of 0, 1, 2, 3, and 4, if the predetermined value is 3, an initial value having a magnitude of 3 and an initial value having a magnitude of 4 are not corrected or modified. If the predetermined value is 4, an initial value having a magnitude of 4 is not corrected or modified. In some embodiments of the disclosed technology, the initial value corrector 222 may determine all initial values as target initial values for correction or modification. Hereinafter, correcting or modifying an initial value may mean correcting or modifying a target initial value for correction or modification.

In an embodiment of the disclosed technology, the initial value corrector 222 may reduce the magnitude of all or part of the initial values in consideration of the number of trapping sets detected. In order to correct or modify the initial values, the initial value corrector 222 may receive the number of detected trapping sets from the trapping set detection number manager 212. For example, the amount of decrease in the magnitude of the initial values increases as the number of detected trapping sets increases. For example, the initial value corrector 222 may reduce the magnitude of all or part of the initial values by the first value when a first trapping set is detected, and may reduce the magnitude of all or part of the initial values by a second value when a second trapping set is detected. The second value may be greater than the first value. For example, the first value may be one and the second value may be two. In this case, each of the initial values may maintain the original sign and an initial value having a magnitude of zero may not be corrected.

In an embodiment of the disclosed technology, the initial value corrector 222 may reduce the initial values by different magnitudes. For example, the initial value corrector 222 may reduce the initial values by different magnitudes in consideration of the number of UCNs corresponding to each of the variable nodes. The initial value corrector 222 may receive, from the UCN number information manager 214, the information about the number of UCNs coupled to each of the variable nodes at the current iteration. For example, the more UCNs a variable node is coupled to, the larger the amount of decrease in the magnitude of an initial value corresponding to the variable node. For example, the initial value corrector 222 may reduce a magnitude of an initial value corresponding to a variable node coupled to two UCNs by the first value, and may reduce a magnitude of an initial value corresponding to a variable node coupled to three UCNs by the second value. The second value may be greater than the first value. For example, the first value may be one and the second value may be two.

The variable node value corrector 224 may invert at least one of the variable node values. A value of a variable node is inverted by reversing a sign of the value while maintaining the magnitude thereof. For example, when a trapping set is detected in an ith iteration, the variable node value corrector 224 may invert at least one of the variable node values corresponding to the ith iteration. Inversion may be performed according to at least one of the inversion rules stored in the inversion rule storage 226. The variable node value corrector 224 may invert a variable node value of a variable node satisfying conditions defined in the inversion rules.

A first inversion rule may specify that a value of a variable node should be inverted according to the number of UCNs coupled to the variable node. For example, the first inversion rule may specify that a value of a variable node should be inverted when the number of UCNs coupled to the variable node is greater than or equal to a first threshold value. For example, when the first threshold value is four, a value of a variable node coupled to four or more UCNs may be inverted.

In an embodiment of the disclosed technology, the first threshold value may be set based on a degree of the variable node. For example, the greater the degree of the variable node, the greater the first threshold value. For example, the first threshold value corresponding to a variable node with a degree of five may be set to four. As another example, the first threshold value corresponding to a variable node with a degree of four may be set to three.

In an embodiment of the disclosed technology, the first threshold value may be set based on an iteration number where a trapping set occurs. For example, the greater the iteration number where the trapping set occurs, the smaller the first threshold value. For example, the first threshold value corresponding to the first iteration may be set to four, and the first threshold value corresponding to an iteration followed by the first iteration may be set to three.

A second inversion rule may specify that a value of a variable node should be inverted according to the number of UCNs coupled to the variable node and a degree of the variable node. For example, the second inversion rule may specify that a value of a variable node that has a degree of a predetermined value or more and is coupled to UCNs, the number of which is greater than or equal to a second threshold value, should be inverted. For example, when the predetermined value is four and the second threshold value is three, a value of a variable node having a degree of four or more and coupled to three or more UCNs may be inverted.

In an embodiment of the disclosed technology, the second inversion rule may specify the second threshold value varying depending on an index of the variable node. For example, the second inversion rule may specify that the second threshold value should increase as the index of the variable node decreases, and the second threshold value should decrease as the index of the variable node increases. This embodiment may be effectively applicable when, in a parity check matrix, columns with higher degrees are located at lower indices and columns with lower degrees are located at higher indices.

A third inversion rule may specify that a value of a variable node coupled to a largest number of UCNs, among the variable nodes, should be inverted. The third inversion rule may be applicable regardless of the degree of the variable node.

The variable node value corrector 224 may correct or modify a variable node value by applying at least one of the first to third inversion rules whenever a trapping set is detected. In an implementation, the variable node value corrector 224 may apply one of the first to third inversion rules whenever a trapping set is detected, or in another implementation, the variable node value corrector 224 may apply a combination of two or more of the first to third inversion rules whenever a trapping set is detected. For example, the variable node value corrector 224 may sequentially apply the first, second and third inversion rules whenever a trapping set is detected. For example, whenever a trapping set is detected, the variable node value corrector 224 may apply the same inversion rule, thereby applying the same inversion rules more than once. For example, whenever a trapping set is detected, the variable node value corrector 224 may apply the inversion rules in the sequence the first inversion rule, the second inversion rule, the third inversion rule, the second inversion rule, and the first inversion rule.

The variable node value corrector 224 may select one or more of the variable nodes as search target variable nodes to which an inversion rule is applied. In an embodiment of the disclosed technology, the variable node value corrector 224 may select, as search target variable nodes, variable nodes having a degree that is equal to or higher than a predetermined value, among the variable nodes. The degree of the variable nodes may be checked through a parity check matrix. In an embodiment, the variable node value corrector 224 may select, as search target variable nodes, variable nodes coupled to a largest number of UCNs, among the variable nodes. In an embodiment, the variable node value corrector 224 may select, as search target variable nodes, a predetermined number of variable nodes, starting from a variable node having a smallest index, or may select, as search target variable nodes, a predetermined number of variable nodes, starting from a variable node having a largest index.

In an embodiment, in correcting or modifying a value of a variable node by applying at least one of the first to third inversion rules, the variable node value corrector 224 may first search the search target variable nodes that satisfies conditions specified in the inversion rule in a certain sequence. For example, the variable node value corrector 224 may first search the search target variable nodes in a sequence in which an index of a variable node increases, or in a sequence in which the index decreases, or in a sequence in which the index increases first and then decreases. In this way, the variable node value corrector 224 may correct values of the searched target variable nodes.

In an embodiment of the disclosed technology, the variable node value corrector 224 may search the search target variable nodes that satisfies conditions specified in inversion rules according to a trapping set number or an iteration number where a trapping set occurs, while changing at least one of the number of searches and a sequence of searches.

For example, the variable node value corrector 224 may search the search target variable nodes in a direction where an index increases when a trapping set occurs in an odd-numbered iteration or when an odd-numbered trapping set occurs, and may search the search target variable nodes in a direction where an index decreases when a trapping set occurs in an even-numbered iteration or when an even-numbered trapping set occurs. For example, the variable node value corrector 224 may search the search target variable nodes in a direction where an index increases when a trapping set occurs in an odd-numbered iteration or an odd-numbered trapping set occurs, and may search the search target variable nodes in a direction where an index decreases, and then in a direction where the index increases when a trapping set occurs in an even-numbered iteration or an even-numbered trapping set occurs.

FIG. 3 is a diagram illustrating an example of a parity check matrix.

FIG. 3 illustrates an example of a parity check matrix H defining an (n, k) code. The (n, k) code may be defined as a parity check matrix having a size of (n–k)×n. Each of the entries of the parity check matrix may be represented by "0" or "1," and the (n, k) code may be referred to as an (n, k) LDPC code when the number of 1s included in the parity check matrix H is much smaller than the number of 0s. Here, n and k may be natural numbers. In FIG. 3, the parity check matrix H defining a (7, 4) code is illustrated by way of example.

A matrix with entries each of which includes a sub-matrix may be referred to as a base matrix. Each of the entries of the base matrix may be a sub-matrix having a size of z×z. Here, z may be an integer of 2 or more. For example, "0" in the base matrix may indicate that the corresponding entry is a zero matrix, and "1" in the base matrix may indicate that the corresponding entry is not a zero matrix. For example, when the base matrix is used in a quasi cyclic (QC)-LDPC code, "1" may indicate that the corresponding entry is a circulant matrix (also referred to as cyclic permutation matrix). The circulant matrix may be obtained by cyclically shifting an identity matrix by a predetermined shift value, and one circulant matrix may have a different shift value from another circulant matrix.

FIG. 4 is a Tanner graph of the parity check matrix shown in FIG. 3.

The (n, k) code may be represented by a Tanner graph which is a representation of an equivalent bipartite graph and includes two types of nodes. As an example, the Tanner graph of FIG. 4 is represented by (n–k) check nodes, n variable nodes, and edges. The check nodes may correspond to rows of the parity check matrix, and the variable nodes may correspond to columns of the parity check matrix. Each of the edges may couple one check node to one variable node and indicate an entry represented by "1" in the parity check matrix.

The parity check matrix of the (7, 4) code illustrated in FIG. 3 may be represented by a Tanner graph including three check nodes $CN_1$ to $CN_3$ and seven variable nodes $VN_1$ to $VN_7$, as illustrated in FIG. 4. Solid lines connecting the check nodes $CN_1$ to $CN_3$ to the variable nodes $VN_1$ to $VN_7$ may indicate the edges.

Iterative decoding may be performed based on an iterative message passing algorithm between the check nodes $CN_1$ to $CN_3$ and the variable nodes $VN_1$ to $VN_7$ on the Tanner graph, such as that illustrated in FIG. 4. In each iteration, iterative decoding may be performed while messages are transmitted between the check nodes $CN_1$ to $CN_3$ and the variable nodes $VN_1$ to $VN_7$.

The variable nodes may perform error correction using C2V messages received from check nodes coupled thereto. The variable nodes may generate V2C messages to be transmitted to the check nodes coupled thereto and may transmit the generated V2C messages to the check nodes respectively corresponding thereto.

Check nodes may update values of check nodes using V2C messages received from variable nodes coupled thereto. The check nodes may generate C2V messages to be transmitted to the variable nodes coupled thereto and may transmit the generated C2V messages to the variable nodes respectively corresponding thereto.

FIG. 5 is a diagram illustrating an example of a syndrome vector calculated using the parity check matrix H shown in FIG. 3.

As described above, a syndrome vector $S_i$ may be generated based on the parity check matrix H and a transpose $C_i^T$ of a hard decision vector $C_i$ corresponding to an ith iteration. Respective entries $S_{i1}$, $S_{i2}$, and $S_{i3}$ of the syndrome vector $S_i$ may correspond to check nodes $CN_1$, $CN_2$ and $CN_3$, respectively, in the Tanner graph illustrated in FIG. 4.

If all the entries $S_{i1}$, $S_{i2}$, and $S_{i3}$ of the syndrome vector $S_i$ indicate zero ("0"), it is determined that the syndrome vector $S_i$ has passed a syndrome check. Therefore, iterative decoding on the corresponding read values may be terminated, and the hard decision vector $C_i$ corresponding to the ith iteration may be output as a decoded codeword.

In case at least one of the entries $S_{i1}$, $S_{i2}$, and $S_{i3}$ of the syndrome vector $S_i$ is nonzero, it is determined that the syndrome vector $S_i$ has failed to pass the syndrome check. In other words, it is determined that the error correction of the read data was unsuccessful. Therefore, a next iteration may be performed unless the number of iterations reaches the maximum iteration number. Here, a check node corresponding to the nonzero symbol may be called unsatisfied check node (UCN).

Figure 6:
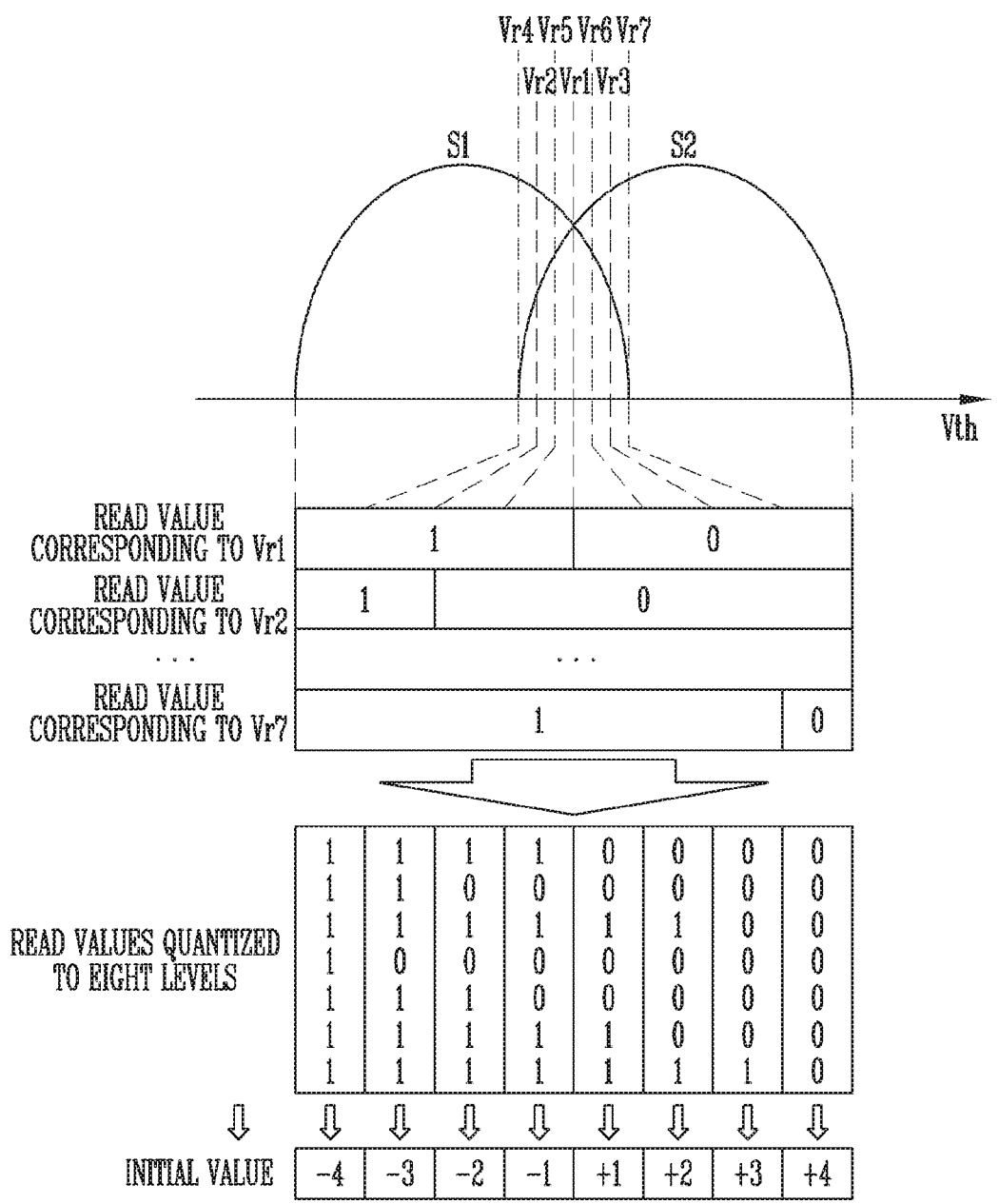
FIG. 6 is a diagram illustrating an example of an initial value generation process using g read values during soft decision decoding.

FIG. 6 is a diagram illustrating an example of an initial value generation process using g read values during soft decision decoding.

FIG. 6 illustrates threshold voltage (Vth) distributions of a plurality of memory cells each having one of a first state S1 and a second state S2.

For n-bit multi-level cell NAND flash memory, the threshold voltage of each cell can be programmed to $2^n$ possible values. In an ideal multi-level cell NAND flash memory, each value corresponds to a non-overlapping threshold voltage window (not shown in FIG. 6). In FIG. 6, the vertical axis indicates the number of memory cells that has a particular threshold voltage represented on the horizontal axis. Memory cells programmed to the same value have their threshold voltages fall into the same window, but their exact threshold voltages could be different. As program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using error correction codes (ECC).

In order to obtain g read vectors corresponding to one codeword when quantization level g+1 is used, each of g read voltages may be sequentially applied to a plurality of memory cells. For example, one read voltage may be applied when a quantization level 2 is used, and two read voltages may be sequentially applied when a quantization level 3 is used. In the same manner, as shown in FIG. 6, seven read voltages Vr1, Vr2, Vr3, Vr4, Vr5, Vr6, and Vr7 may be sequentially applied to each memory cell when a quantization level 8 is used. When the quantization level g+1 is used, g read values are applied to every memory cell, so that the g read values can be obtained for each memory cell.

When one of the g read voltages is applied to the plurality of memory cells, a read value of a memory cell having a threshold voltage lower than the applied read voltage may be represented as "1," and a read value of a memory cell having a threshold voltage higher than the applied read voltage may be represented as "0."

For example, as shown in FIG. 6, when the seven read voltages Vr1, Vr2, Vr3, Vr4, Vr5, Vr6, and Vr7 are used, seven read values per memory cell may be obtained.

The error correction circuit 10 may generate a (g+1) level quantized read values by using the read values corresponding to each of the g read voltages. For example, as shown in FIG. 6, when the seven read voltages are used, the error correction circuit 10 may generate an 8-level quantized read value by combining the read values corresponding to each of the seven read voltages.

The error correction circuit 10 may convert or map the (g+1) level quantized read value into initial value (e.g., LLR value). The conversion or mapping into the initial value may be performed with reference to a predetermined lookup table.

FIG. 7 is a diagram illustrating an example of a lookup table.

The lookup table may define LLR values corresponding to each of a plurality of quantization levels. As discussed above, the neighboring threshold voltage distributions may overlap, and the memory cells with threshold voltages that fall within the overlapping range of the neighboring distributions may be corrected by using the ECC such as an iterative decoding scheme. In some implementation, an initial value of the iterative decoding scheme is obtained by computing the log likelihood of the probability of falling in certain decision regions of the overlapping range of the neighboring threshold voltage distributions.

The error correction circuit 10 may convert each of (g+1) level quantized read values, which are quantized into g+1 quantization level, into any of g+1 LLR values corresponding to quantization level g+1, with respect to the lookup table.

In a scenario where the number of quantization level is two (2), the error correction circuit 10 may convert one of 2-level quantized read values into a log likelihood ratio value LLR1, and convert the other of the 2-level quantized read values into a log likelihood ratio value LLR2. For example, "1" of the 2-level quantized read values may be converted into a log likelihood ratio value "−4," which is the value LLR1, and "0" of the 2-level quantized read values may be converted into a log likelihood ratio value "+4," which is the value LLR2.

Figure 8:
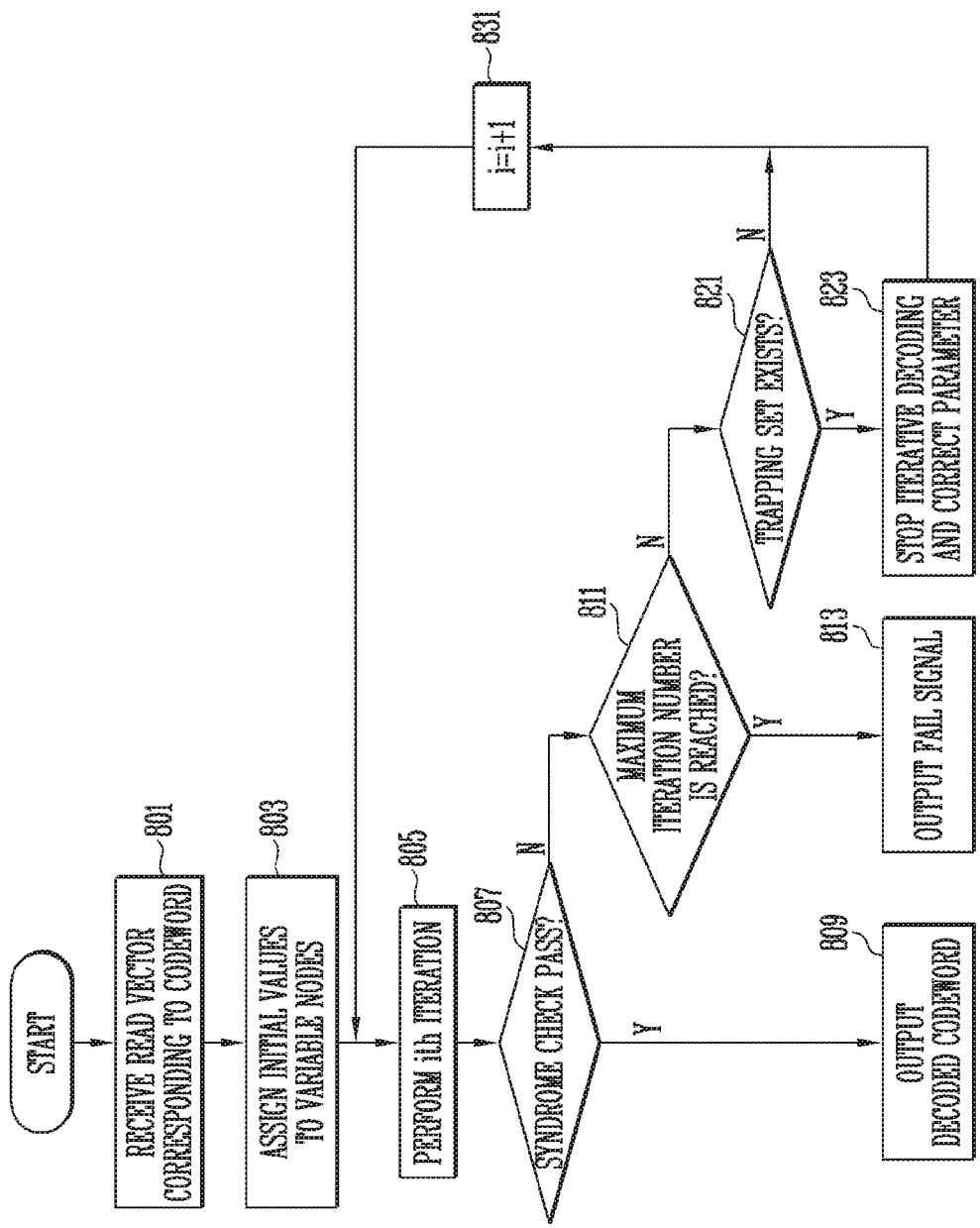
FIG. 8 is a flowchart illustrating an example of an operating method of an error correction circuit illustrated in FIG. 2.

FIG. 8 is a flowchart illustrating an example of an operating method of an error correction circuit illustrated in FIG. 2.

At step 801, the error correction circuit 10 may receive a read vector corresponding to a codeword. For example, the read vector may include read values corresponding to a plurality of memory cells, respectively.

At step 803, the error correction circuit 10 may assign initial values to variable nodes. When the error correction circuit 10 receives g read vectors corresponding to a single codeword, the error correction circuit 10 may generate a (g+1) level quantized read vector. The error correction circuit 10 may convert the (g+1) level quantized read vector into initial vector. For example, the initial vector may include initial values corresponding to a plurality of variable nodes, respectively. Each of the initial values may be an LLR value.

At step 805, the error correction circuit 10 may perform an ith iteration within the maximum iteration number I according to an iterative decoding scheme. In the ith iteration, V2C messages and C2V messages may be exchanged, so that the variable nodes and check nodes may be updated.

At step 807, the error correction circuit 10 may perform a syndrome check corresponding to the ith iteration. When all the elements of the syndrome vector are zero (syndrome check "pass"), at step 809, the error correction circuit 10 may output a hard decision vector corresponding to the ith iteration as a decoded codeword. When there is at least one nonzero element in the syndrome vector (syndrome check "fail"), step 811 may be carried out.

At step 811, the error correction circuit 10 may determine whether iterations are performed by the maximum iteration number I. When it is determined at step 811 that the iterations has reached the maximum iteration number I, step 813 may be carried out, and when it is determined that the iterations has not reached the maximum iteration number I, step 821 may be carried out.

At step 813, in case a valid codeword is not generated although the iterations has reached the maximum iteration number I, the error correction circuit 10 may output a "fail" signal indicating that error correction decoding has failed.

At step 821, the error correction circuit 10 may check whether a trapping set exists. In other words, the error correction circuit 10 may detect a trapping set when the trapping set occurs during an iterative decoding process. The trapping set may be detected according to a predetermined trapping set determination policy. For example, the trapping set may be detected on the basis of at least one of a syndrome vector and the number of UCNs in the ith iteration.

When the trapping set is detected as a result of determination at step 821, the error correction circuit 10 may stop the iterative decoding process at step 823. In other words, the error correction circuit 10 may stop the error correction decoding when the trapping set is detected even before the number of iterations reaches the maximum iteration number I. In addition, at step 823, the error correction circuit 10 may correct a parameter used for iterative decoding. When the parameter is corrected, the next iteration may be performed at step 805 via step 831. Hereinafter, the parameter correction process at step 823 will be described in more detail with reference to FIG. 9.

Figure 9:
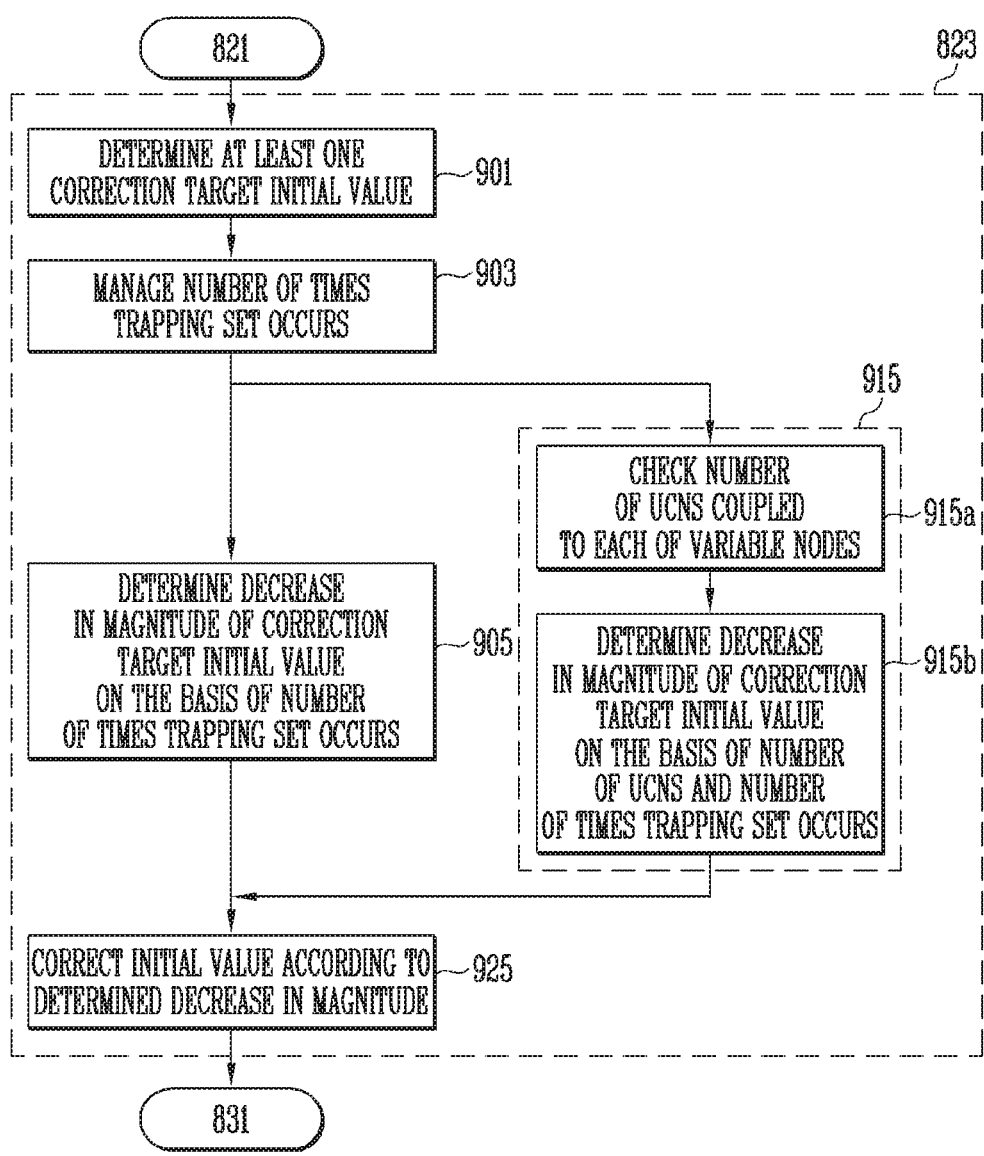
FIG. 9 is a flowchart illustrating an example of an initial value correction process based on an embodiment of the disclosed technology.

FIG. 9 is a flowchart illustrating an example of an initial value correction process based on an embodiment of the disclosed technology.

At step 901, the error correction circuit 10 may determine one or more of initial values as target initial values for correction or modification. For example, the error correction circuit 10 may determine initial values having a magnitude less than a predetermined value, among the initial values, as target initial values for correction or modification. For example, when it is assumed that the predetermined value is three, the error correction circuit 10 may select the initial values less than three, among the initial values, as the target initial values for correction or modification.

At step 903, the error correction circuit 10 may manage information including the number of occurrences of a trapping set. For example, the error correction circuit 10 may manage information about the number of occurrences of the trapping set during iterative decoding.

In some embodiments of the disclosed technology, step 905 or step 915 may be selectively performed.

The process flow where step 905 is carried out will be described first.

At step 905, the error correction circuit 10 may determine the amount of decrease in the magnitude of a target initial value for correction or modification on the basis of the number of occurrences of the trapping set. For example, the error correction circuit 10 may determine the amount of decrease in the magnitude of the target initial value for correction or modification such that the amount of decrease increases as the number of occurrences of the trapping set increases.

Next, the process flow where step 915 is carried out will be described.

At step 915a, the error correction circuit 10 may check the number of UCNs coupled to each of the variable nodes. In some embodiments of the disclosed technology, the error correction circuit 10 may check only the number of UCNs coupled to a variable node corresponding to the target initial value for correction or modification.

At step 915b, the error correction circuit 10 may determine the amount of decrease in the magnitude of the target initial value for correction or modification on the basis of the number of UCNs and the number of occurrences of the trapping set. For example, the error correction circuit 10 may determine the amount of decrease in the magnitude of the target initial value for correction or modification such that the amount of decrease increases as the number of occurrences of the trapping set increases. In addition, the error correction circuit 10 may determine the amount of decrease in the magnitude of the target initial value for correction or modification such that the amount of decrease increases as the number of UCNs coupled to a variable node corresponding to the correction target initial value increases.

At step 925, the error correction circuit 10 may correct or modify an initial value according to the determined amount of decrease in the magnitude of the target initial value for correction or modification. When the initial value is corrected or modified, step 831 of FIG. 8 may be carried out.

FIG. 10 is a diagram illustrating an example of an initial value correction method based on an embodiment of the disclosed technology.

For convenience of explanation, FIG. 10 illustrates an example of an initial vector including initial values corresponding to four variable nodes $VN_1$, $VN_2$, $VN_3$, and $VN_4$. Referring to FIG. 10, it may be shown that an initial value of "3" is assigned to the first variable node $VN_1$, an initial value of "2" is assigned to the second variable node $VN_2$, an initial value of "1" is assigned to the third variable node $VN_3$, and an initial value of "−2" is assigned to the fourth variable node $VN_4$.

The error correction circuit 10 may determine initial values having a magnitude less than a predetermined value, among the initial values corresponding to the variable nodes $VN_1$, $VN_2$, $VN_3$, and $VN_4$, as target initial values for correction or modification. When the predetermined value is three, initial values less than three, i.e., the initial values corresponding to the second variable node $VN_2$, the third variable node $VN_3$, and the fourth variable node $VN_4$ are selected as the target initial values for correction or modification.

The error correction circuit 10 may reduce the magnitude of all or part of the target initial values for correction or modification whenever a trapping set occurs. Here, a sign (e.g., plus sign or minus sign) of each of the correction target initial values may be maintained. The amount of decrease in the magnitude of the target initial values for correction or modification may vary depending on the number of occurrences of the trapping set. For example, the amount of decrease in the magnitude of the target initial value for correction or modification may be determined by a first value when a first trapping set occurs, and by a second value greater than the first value when a second trapping set occurs.

FIG. 10 illustrates an example in which the first value is one and the second value is two. Referring to FIG. 10, when a first trapping set occurs, the magnitude of each of the initial values corresponding to the variable nodes $VN_2$, $VN_3$, and $VN_4$ may be reduced by one. In addition, when a second trapping set occurs, the magnitude of each of the initial values corresponding to the variable nodes $VN_2$ and $VN_4$ may be reduced by two. An initial value having a magnitude less than the amount of decrease in magnitude may be corrected into zero. Referring to FIG. 10, when the second trapping set occurs, the initial value corresponding to the variable node $VN_3$ is corrected or modified into zero.

FIG. 11 is a diagram illustrating an example of an initial value correction method based on another embodiment of the disclosed technology.

For convenience of explanation, FIG. 11 illustrates an example of an initial vector including initial values corresponding to the four variable nodes $VN_1$, $VN_2$, $VN_3$, and $VN_4$. Referring to FIG. 11, it may be shown that the initial value of "3" is assigned to the first variable node $VN_1$, the initial value of "2" is assigned to the second variable node $VN_2$, the initial value of "2" is assigned to the third variable node $VN_3$, and an initial value of "−2" is assigned to the fourth variable node $VN_4$.

The error correction circuit 10 may determine initial values having a magnitude less than a predetermined value, among the initial values corresponding to the variable nodes $VN_1$, $VN_2$, $VN_3$, and $VN_4$, as target initial values for correction or modification. When the predetermined value is three, initial values less than three, i.e., the initial values corresponding to the second variable node $VN_2$, the third variable node $VN_3$, and the fourth variable node $VN_4$ are selected as the target initial values for correction or modification.

The error correction circuit 10 may reduce the magnitude of all or part of the target initial values for correction or modification in consideration of the number of UCNs coupled to each of the variable nodes corresponding to the correction target initial values whenever a trapping set occurs. For example, the amount of decrease in the magnitude of a correction target initial value increases as the number of UCNs coupled to a variable node increases.

Referring to FIG. 11, although all initial values corresponding to the variable nodes $VN_2$, $VN_3$, and $VN_4$ are two, the number of UCNs coupled to the variable node $VN_3$ is one, and the number of UCNs coupled to each of the variable nodes $VN_2$ and $VN_4$ is two. Therefore, the error correction circuit 10 may more reduce the magnitude of each of the initial values corresponding to the variable nodes $VN_2$ and $VN_4$ than that of the initial value corresponding to the variable node $VN_3$. Referring to FIG. 11, when the first trapping set occurs, the initial value of each of the variable nodes $VN_2$ and $VN_4$ coupled to two UCNs may be reduced by two, and the initial value of the variable node $VN_3$ coupled to one UCN may be reduced by one.

Figure 12:
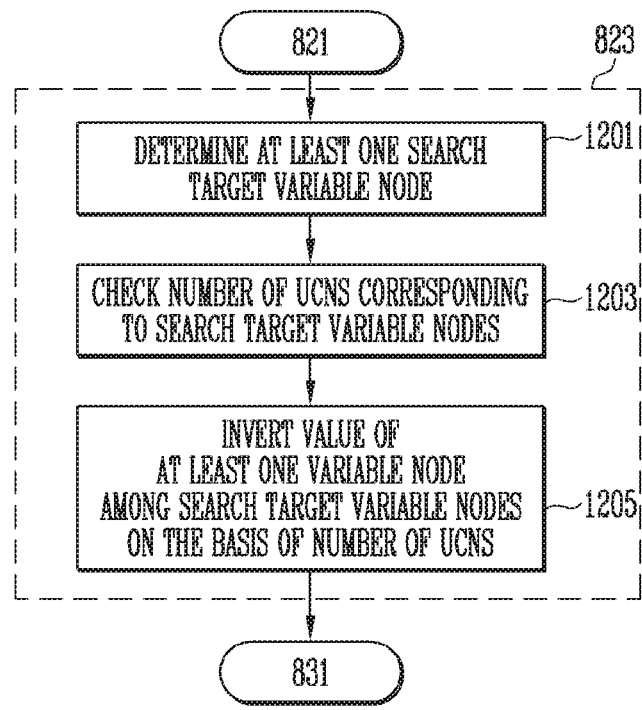
FIG. 12 is a flowchart illustrating an example of a variable node value correction process based on an embodiment of the disclosed technology.

FIG. 12 is a flowchart illustrating an example of a variable node value correction process based on an embodiment of the disclosed technology.

At step 1201, the error correction circuit 10 may select at least one of variable nodes as search target variable nodes.

In an embodiment of the disclosed technology, the error correction circuit 10 may select all variable nodes as search target variable nodes. In another embodiment of the disclosed technology, the error correction circuit 10 may select, as search target variable nodes, variable nodes having a degree of a predetermined value or more, among the variable nodes. In another embodiment of the disclosed technology, the error correction unit 10 may select, as search target variable nodes, variable nodes coupled to the largest number of UCNs, among the variable nodes. In another embodiment of the disclosed technology, the error correction circuit 10 may select, as search target variable nodes, a predetermined number of variable nodes, starting from a variable node having the lowest index, among variable nodes, or may select, as search target variable nodes, a predetermined number of variable nodes, starting from a variable node having the highest index, among the variable nodes. For example, in case a thousand variable nodes having indices Nos. 1 to 1000 exist, the error correction circuit 10 may select, as search target variable nodes, variable nodes having indices Nos. 1 to 100 or variable nodes having indices Nos. 901 to 1000.

At step 1203, the error correction circuit 10 may check the number of UCNs corresponding to each of the search target variable nodes.

In an embodiment of the disclosed technology, when a sign of a value of a search target variable node corresponding to an ith iteration does not coincide with a sign of an initial value of the search target variable node, the error correction circuit 10 may increase the number of UCNs corresponding to the search target variable node by one.

At step 1205, the error correction circuit 10 may invert a value of at least one of the search target variable nodes on the basis of the number of UCNs.

In an embodiment of the disclosed technology, the error correction circuit 10 may invert a value of a variable node coupled to a predetermined threshold value or more of UCNs, among the search target variable nodes. In an embodiment of the disclosed technology, the predetermined threshold value may be set depending on a degree of a variable node. For example, the greater the degree of the variable node, the greater the threshold value. In an embodiment of the disclosed technology, a threshold value may be set depending on an iteration number where a trapping set occurs. For example, the greater the iteration number where a trapping set occurs, the smaller the threshold value. In an embodiment of the disclosed technology, the error correction circuit 10 may invert values of variable nodes coupled to the largest number of UCNs, among the search target variable nodes.

When a value of at least one variable node is inverted, step 831 of FIG. 8 may be carried out.

Figure 13:
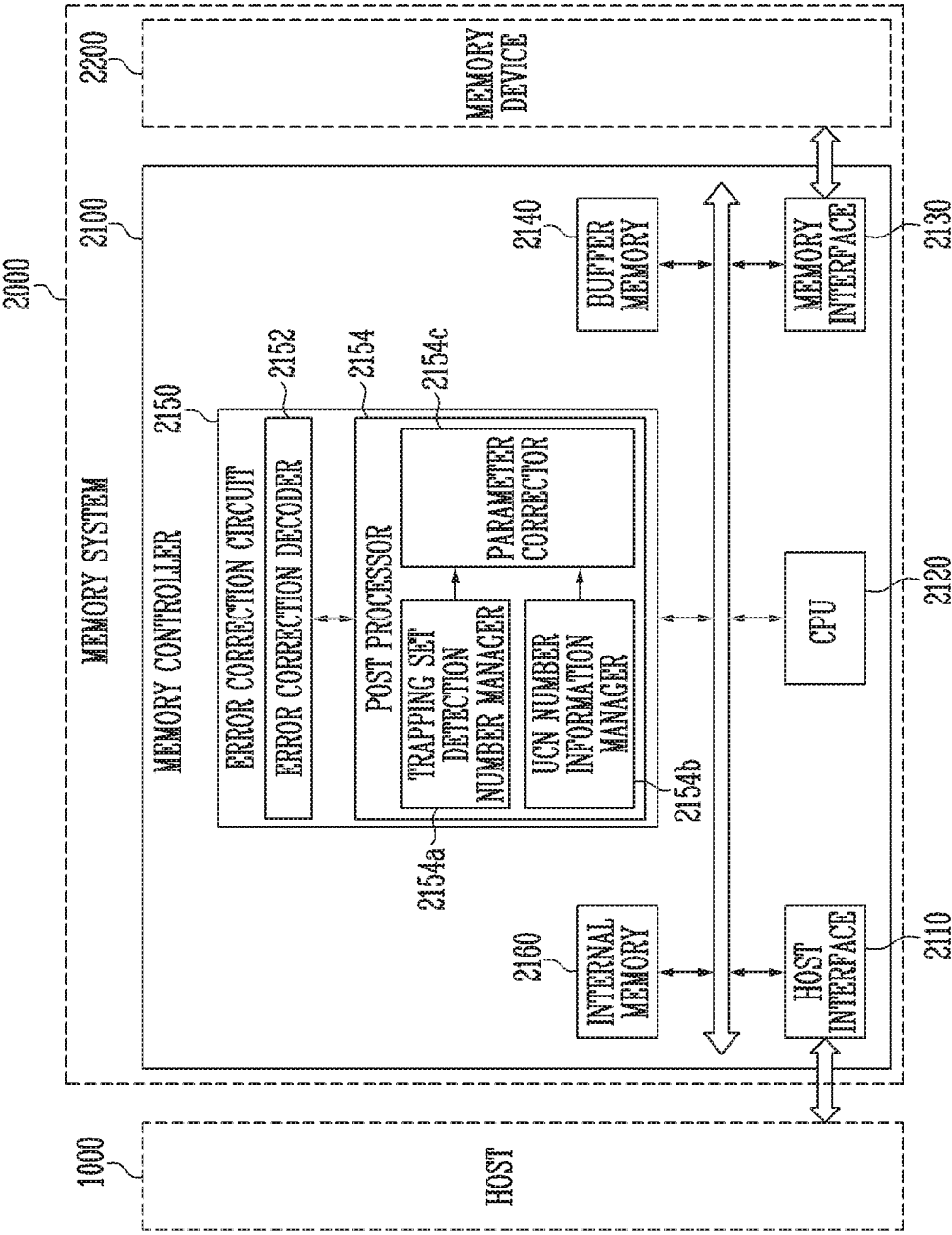
FIG. 13 is a diagram illustrating an example of a memory system based on an embodiment of the disclosed technology.

FIG. 13 is a diagram illustrating an example of a memory system 2000 based on an embodiment of the disclosed technology.

Referring to FIG. 13, a memory system 2000 may include a memory device 2200 which stores data, and a memory controller 2100 which controls the memory device 2200 under the request of a host 1000.

The host 1000 may communicate with the memory system 2000 by using an interface protocol such as Peripheral Component Interconnect-Express (PCI-E), Advanced Technology Attachment (ATA), Serial ATA (SATA), Parallel ATA (PATA), or serial attached SCSI (SAS). However, the interface protocols between the host 1000 and the memory system 2000 may not be limited to the above examples and may include various interface protocols such as a Universal Serial Bus (USB), a Multi-Media Card (MMC) an Enhanced Small Disk Interface (ESDI), or Integrated Drive Electronics (IDE). The host 1000 can be a device or a system that includes one or more computer processors which operate to retrieve digital information or data from the memory system 2000 or store or write digital information or data into the memory device 2000. In various applications, the host 1000 can be in various forms, including, for example, a personal computer (PC), a portable digital device, a tablet PC, a digital camera, a digital audio player, a digital multimedia player, a television, a wireless communication device, a cellular phone, console video game hardware, or a digital set-top box.

The memory controller 2100 may control the general operations of the memory system 2000 and control data exchange between the host 1000 and the memory device 2200. For example, the memory controller 2100 may convert received information, and store and output the converted information so that commands, addresses, and data may be transmitted/received between the host 1000 and the memory device 2200. During a program operation, the memory controller 2100 may transfer commands, addresses, and data to the memory device 2200.

The memory controller 2100 may include a host interface 2110, a Central Processing Unit (CPU) 2120, a memory interface 2130, a buffer memory 2140, an error correction circuit 2150, and an internal memory 2160. The host interface 2110, the memory interface 2130, the buffer memory 2140, the error ECC circuit 2150, and the internal memory 2160 may be controlled by the CPU 2120.

The host interface 2110 may perform data exchange with the host 1000 using the interface protocol.

The CPU 2120 may perform various operations or generate a command and an address to control the memory device 2200. For example, the CPU 2120 may generate various commands necessary for performing a program operation, a read operation, an erase operation, a data compression operation, and a copyback operation.

The memory interface 2130 may communicate with the memory device 2200 using a communication protocol.

The buffer memory 2140 may temporarily store data when the memory controller 2100 controls the memory device 2200. For example, the data received from the host 1000 may be temporarily stored in the buffer memory 2140 until a program operation is completed. In addition, during a read operation, data read from the memory device 2200 may be temporarily stored in the buffer memory 2140.

The error correction circuit 2150 may perform error correction encoding during the program operation and error correction decoding during the read operation. The error correction circuit 2150 may include an error correction decoder 2152 and a post processor 2154.

The error correction decoder 2152 may perform error correction decoding on data (read values) read from the memory device 2200. The error correction decoder 2152 may correct an error using a parity check matrix when the error is detected in an iterative decoding process for error correction. For example, the error correction decoder 2152 may calculate a syndrome corresponding to the read values based on the parity check matrix, and may determine, based on the calculated syndrome, whether an error is included in the read values. The error correction decoder 2152 may correct the error and output error-corrected data when the error included in the read values is correctable. The error correction decoder 2152 may report a decoding failure to the CPU 2120 when the error included in the read values is not correctable. The error correction decoder 2152 may perform the same operation as the error correction decoder 100 as described above with reference to FIG. 2.

The post processor 2154 may include a trapping set detection number manager 2154a, a UCN number information manager 2154b, and a parameter corrector 2154c. The post processor 2154 may perform an operation corresponding to the post processor 200 as shown in FIG. 2. In other words, the trapping set detection number manager 2154a may perform an operation corresponding to that of the trapping set detection number manager 212 as shown in FIG. 2, the UCN number information manager 2154b may perform an operation corresponding to that of the UCN number information manager 214 as shown in FIG. 2, and the parameter corrector 2154c may perform an operation corresponding to that of the parameter corrector 220 as shown in FIG. 2.

The internal memory 2160 may serve as a storage unit storing various types of information necessary for operations of the memory controller 2100.

The memory device 2200 may perform a program operation, a read operation, an erase operation, a data compression operation, and a copy-back operation under the control of the memory controller 2100. The memory device 2200 may be a volatile memory device losing stored data when power supply is blocked, or a non-volatile memory device maintaining the stored data even in the absence of power supply. Hereinafter, according to an embodiment, a flash memory included in a non-volatile memory device will be described as an example. During a program operation, the memory device 220 may program data in response to a command and an address, or may output stored data.

Figure 14:
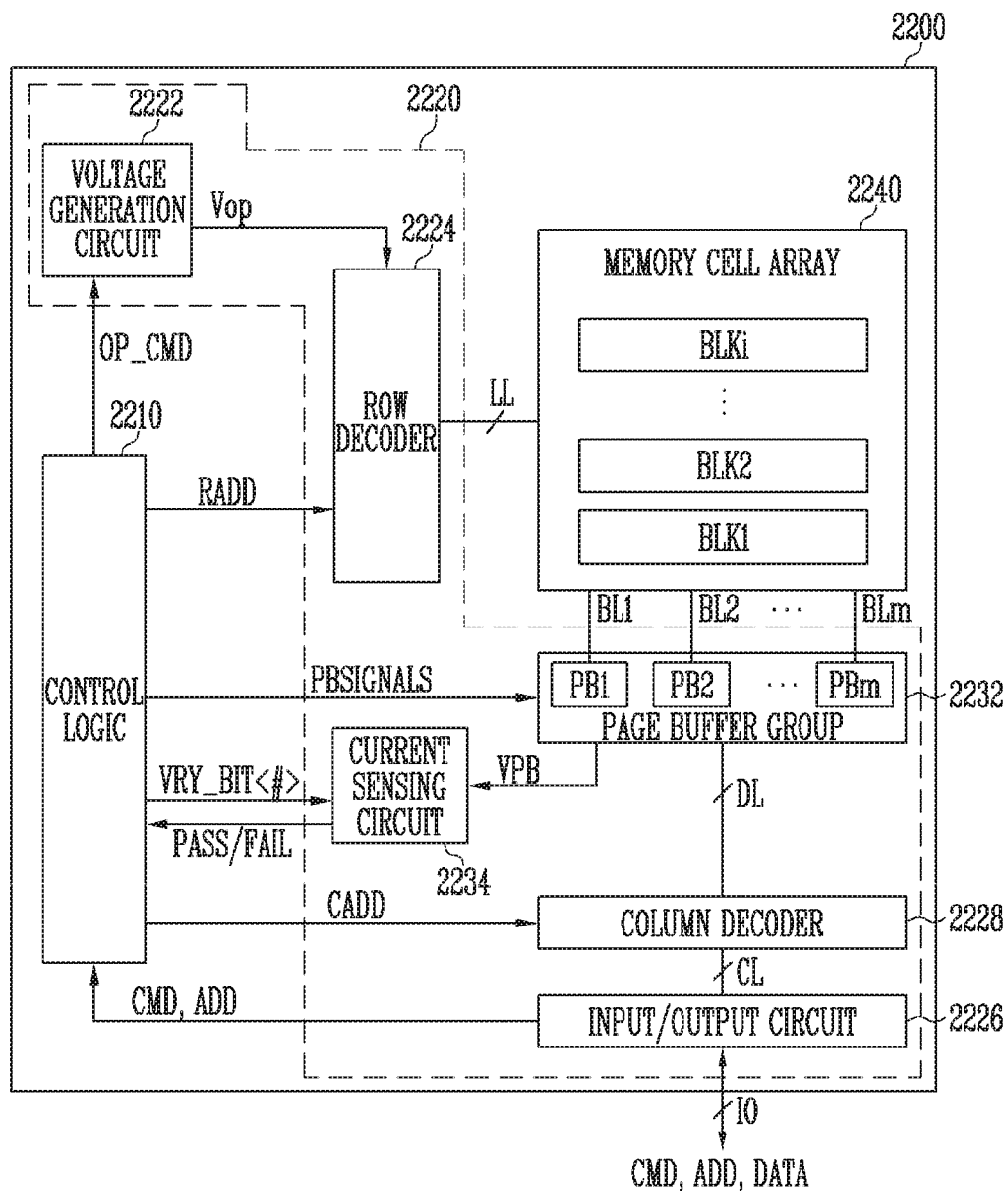
FIG. 14 is a diagram illustrating an example of a memory device based on an embodiment of the disclosed technology.

FIG. 14 is a diagram illustrating an example of a memory device based on an embodiment of the disclosed technology. The memory device illustrated in FIG. 14 may be applied to the memory system of FIG. 13.

The memory device 2200 may include a control logic 2210, peripheral circuits 2220 and a memory cell array 2240. The peripheral circuits 220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 13. The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PBSIGNALS and an allowable bit VRY_BIT<#> in response to the command CMD and the address ADD. The control logic 2210 may determine whether a "verify" operation is successful (whether a target memory cell has passed or failed a program verification) in response to a "pass" signal PASS and a "fail" signal FAIL received from the current sensing circuit 2234.

The peripheral circuits 2220 may perform a selective erase operation to erase selected memory cells, among memory cells included in a selected memory block, in response to control of the control logic 210. In addition, the peripheral circuits 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, etc. to the row decoder 2224 through global lines. In addition, the voltage generation circuit 2222 may float some of the global lines in response to the operation signal OP_CMD.

The row decoder 2224 may transfer the operating voltages Vop to local lines LL coupled to a selected memory block, among memory blocks included in the memory cell array 2240, in response to the row address RADD received from the control logic 2210. The local lines LL may include local word lines, local drain select lines, and local source select lines. In addition, the local lines LL may include various lines coupled to a memory block, such as a source line.

The input/output circuit 2226 may transfer the command CMD and the address ADD received from the memory controller 2100 through input/output lines IO to the control logic 2210, or may exchange the data with the column decoder 2228.

The column decoder 2228 may transfer data between the input/output circuit 2226 and the page buffer group 2232 in response to the column address CADD received from the control logic 2210. For example, the column decoder 2228 may exchange data with page buffers PB1 to PBm through data lines DL, or may exchange data with the input/output circuit 2226 through column lines CL.

The page buffer group 2232 may be coupled to bit lines BL1 to BLm coupled in common to memory blocks BLK1 to BLKi. The page buffer group 2232 may include the plurality of page buffers PB1 to PBm coupled to the bit lines BL1 to BLm. For example, a single page buffer may be coupled to each bit line. The page buffers PB1 to PBm may operate in response to the page buffer control signals PBSIGNALS. For example, the page buffers PB1 to PBm may temporarily store program data received from the memory controller 2100 during a program operation and control voltages applied to the bit lines BL1 to BLm according to the program data. In addition, the page buffers PB1 to PBm may temporarily store data received through the bit lines BL1 to BLm during a read operation, or may sense voltages or currents in the bit lines BL1 to BLm.

The current sensing circuit 2234 may generate a reference current in response to the allowable bit VRY_BIT<#> received from the control logic 2210 during a read operation or a verify operation, and may output the pass signal PASS or the fail signal FAIL by comparing a reference voltage generated by the reference current with a sensing voltage VPB received from the page buffer group 2232.

The memory cell array 2240 may include the plurality of memory blocks BLK1 to BLKi storing data. The memory blocks BLK1 to BLKi may store user data and various types of information for performing the operations of the memory device 2200. The memory blocks BLK1 to BLKi may have a two-dimensional structure or a three-dimensional structure, and may be configured in the same manner.

Figure 15:
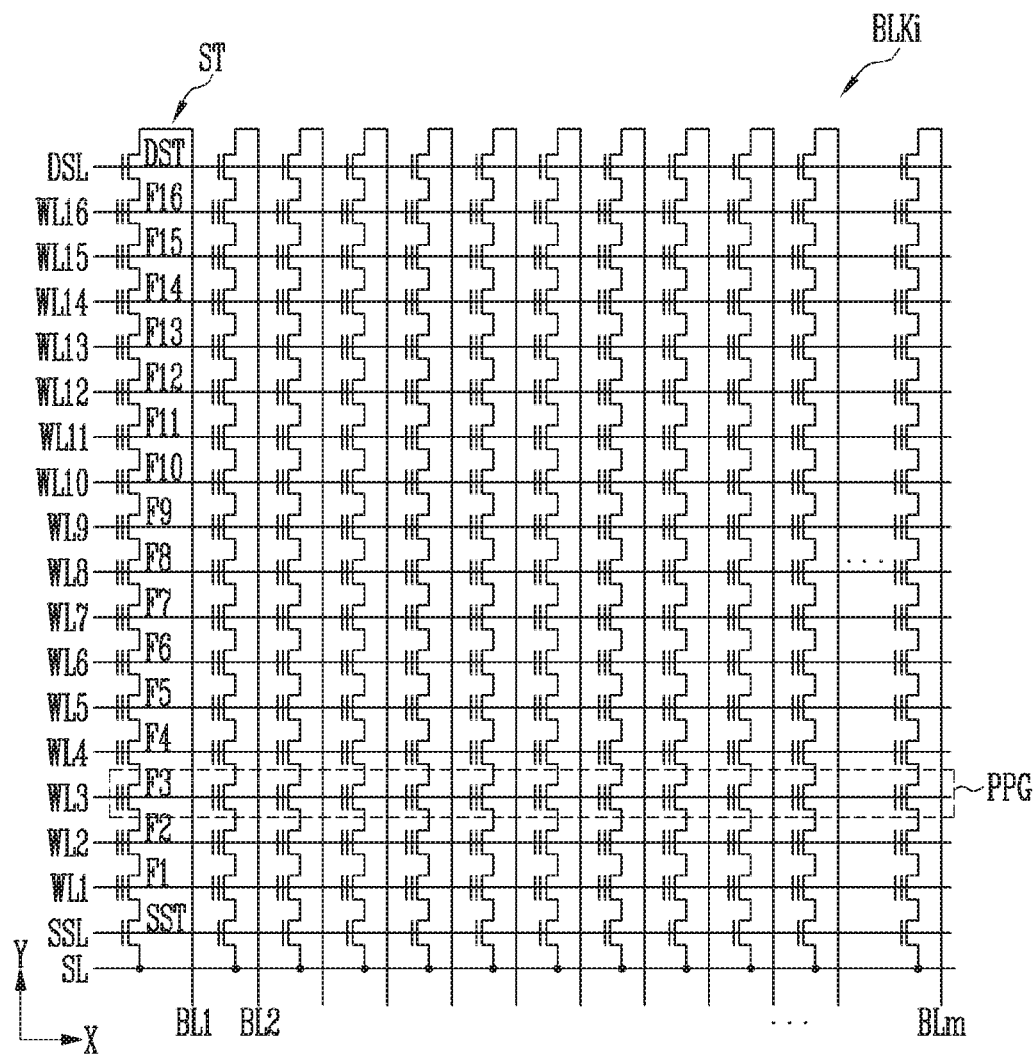
FIG. 15 is a diagram illustrating an example of a memory block.

FIG. 15 is a circuit diagram illustrating an example of a memory block BLKi.

Referring to FIG. 15, the memory block BLKi may be configured such that a plurality of word lines arranged in parallel may be coupled between a first select line and a second select line. The first select line may be a source select line SSL and the second select line may be a drain select line DSL. More specifically, the memory block BLKi may include a plurality of strings (memory cell strings) ST coupled between bit lines BL1 to BLm and a source line SL. Each of the bit lines BL1 to BLm may be coupled to each of the strings ST, and the source line SL may be coupled in common to the strings ST. Since the strings ST may have the same configuration, the string ST coupled to the first bit line BL1 will be described in detail as an example.

The string ST may include a source select transistor SST, a plurality of memory cells F1 to F16, and a drain select transistor DST which are coupled in series to each other between the source line SL and the first bit line BL1. The string ST may include at least one source select transistor SST and at least one drain select transistors DST, and may include more memory cells than the memory cells F1 to F16 as shown in FIG. 15.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page, PPG". Therefore, the memory block BLKi may include as many physical pages PPG as the number of word lines WL1 to WL16.

In an implementation, a single memory cell may store one bit of data. This memory cell may be called a single level cell (SLC). Under the SLC scenario, a single physical page PPG may be mapped to a single logical page LPG. Data of the single logical page LPG may include as many data bits as the number of cells included in the single physical page PPG. Alternatively, a single memory cell may store two or more bits of data. This cell is typically referred to as a "multi-level cell (MLC)". The single physical page PPG may be mapped to two or more logical pages LPG.

A plurality of memory cells included in one physical page PPG may be simultaneously programmed. In other words, the memory device 2200 may perform a program operation on each physical page PPG. A plurality of memory cells included in a single memory block may be simultaneously erased. In other words, the memory device 2200 may perform an erase operation on each memory block BLKi. The memory block BLKi may be referred to as an erase unit block. For example, to update a portion of the data stored in one memory block BLKi, the entire data stored in the corresponding memory block BLKi may be read, the portion of the data which is to be update may be changed, and the entire data may be programmed into another memory block BLKi.

Figure 16:
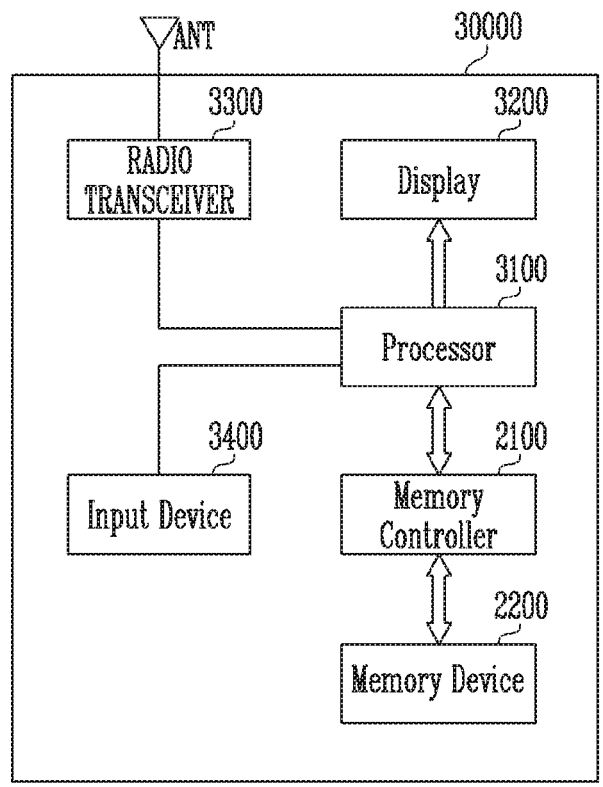
FIG. 16 is a diagram illustrating another example of a memory system including a memory controller of FIG. 13.

FIG. 16 is a diagram illustrating an embodiment of a memory system 30000 including the memory controller 2100 of FIG. 13.

Referring to FIG. 16, the memory system 30000 may be embodied into a cellular phone, a smart phone, a tablet, a personal computer (PC), a personal digital assistant (PDA), or a wireless communication device. The memory system 30000 may include the memory device 2200 and the memory controller 2100 controlling the operations of the memory device 2200.

The memory controller 2100 may control a data access operation of the memory device 2200, for example, a program operation, an erase operation, or a read operation of the memory device 2200 in response to control of a processor 3100.

The memory controller 2100 may control data programmed into the memory device 2200 to be output through a display 3200.

A radio transceiver 3300 may exchange a radio signal through an antenna ANT. For example, the radio transceiver 3300 may change a radio signal received through the antenna ANT into a signal which may be processed by the processor 3100. Therefore, the processor 3100 may process the signal output from the radio transceiver 3300 and transfer the processed signal to the memory controller 2100 or the display 3200. The memory controller 2100 may program the signal processed by the processor 3100 into the semiconductor memory device 2200. In addition, the radio transceiver 3300 may change a signal output from the processor 3100 into a radio signal, and may output the radio signal to an external device through the antenna ANT. A control signal for controlling the operations of the processor 3100 or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the memory controller 2100, data output from the radio transceiver 3300, or data output from an input device 3400 may be output through the display 3200.

In an embodiment, the memory controller 2100 capable of controlling the operation of the memory device 2200 may be implemented as a part of the processor 3100 or as a chip provided separately from the processor 3100.

Figure 17:
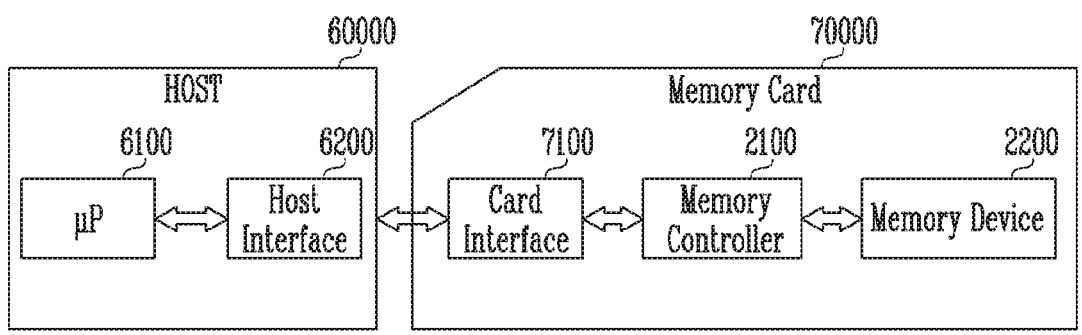
FIG. 17 is a diagrams illustrating another example of a memory system including a memory controller of FIG. 13.

FIG. 17 is a diagram illustrating an embodiment of a memory system 70000 including the memory controller 2100 of FIG. 13.

Referring to FIG. 17, the memory system 70000 may include a memory card or a smart card. The memory system 70000 may include the memory device 2200, the memory controller 2100 and a card interface 7100.

The memory controller 2100 may control data exchange between the memory device 2200 and the card interface 7100. According to an embodiment, the card interface 7100 may be, but not limited thereto, a secure digital (SD) card interface or a multi-media card (MMC) interface.

The card interface 7100 may interface data exchange between the host 60000 and the memory controller 2100 according to a protocol of the host 60000. According to an embodiment, the card interface 7100 may support a Universal Serial Bus (USB) protocol and an InterChip (IC)-USB protocol. The card interface 7100 may refer to hardware that supports a protocol used by the host 60000, software mounted on the hardware, or a signal transmission method.

When the memory system 70000 is connected to an host interface 6200 of the host 60000 such as a PC, a tablet, a digital camera, a digital audio player, a cellular phone, console video game hardware, or a digital set-top pox, the host interface 6200 may perform data communication with the memory device 2200 through the card interface 7100 and the memory controller 2100 in response to control of a microprocessor (µP) 6100.

By implementing the technology disclosed in the present disclosure, the performance of error correction decoding may be improved by solving a trapping set detected during iterative decoding, and in this way error correction decoding may be successfully performed.

Some of the components of the disclosed devices or modules can be implemented as hardware, software, or combinations thereof. For example, a hardware implementation of electronic components can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate.

While the exemplary embodiments of the present disclosure have been disclosed for illustrative purposes, those skilled in the art will appreciate that various modifications, additions and substitutions are possible. Thus, it is intended that the present invention cover all such modifications provided they come within the scope of the appended claims and their equivalents.

What is claimed is:

1. An error correction circuit to perform error correction decoding using an iterative decoding scheme, comprising:
   a node processor to perform a plurality of iterations to update values of one or more variable nodes and one or more check nodes using initial values assigned to the one or more variable nodes, respectively;
   a trapping set detector to detect a trapping set in at least one of the plurality of iterations by applying a predetermined trapping set determination policy; and
   a post processor to reduce at least one of the initial values or invert at least one of values of the variable nodes corresponding to an iteration in which the trapping set is detected, upon detection of the trapping set.

2. The error correction circuit of claim 1, wherein the post processor includes an initial value corrector to reduce all the initial values by a same magnitude upon detection of the trapping set.

3. The error correction circuit of claim 1, wherein the post processor includes an initial value corrector to reduce initial values having a magnitude less than a predetermined value, among the initial values, by a same magnitude upon detection of the trapping set.

4. The error correction circuit of claim 1, wherein the post processor comprises:
   a trapping set detection number manager coupled to an initial value corrector to provide information regarding the number of detections of the trapping set; and
   the initial value corrector to reduce a magnitude of all or part of the initial values in consideration of the number of the detections of the trapping set.

5. The error correction circuit of claim 4, wherein the amount of decrease in the magnitude of each of the initial values increases as the number of detections of the trapping set increases.

6. The error correction circuit of claim 1, wherein the post processor comprises:
   an unsatisfied check node (UCN) number information manager to calculate a number of UCNs coupled to each of the variable nodes at the iteration in which the trapping set is detected; and an initial value corrector to reduce a magnitude of all or part of the initial values in consideration of the number of UCNs coupled to each of the variable nodes.

7. The error correction circuit of claim 6, wherein the more unsatisfied check nodes (UCNs) a variable node is coupled to, the larger the amount of decrease in the magnitude of the initial value corresponding to the variable node.

8. The error correction circuit of claim 1, wherein the post processor comprises:
- an unsatisfied check node (UCN) number information manager to calculate a number of UCNs coupled to each of the variable nodes at the iteration in which the trapping set is detected; and
- a variable node value corrector to select search target variable nodes, among the variable nodes, and invert a value of at least one of the search target variable nodes in consideration of a number of UCNs coupled to each of the search target variable nodes.

9. The error correction circuit of claim 8, wherein the variable node value corrector inverts a value of a search target variable node coupled to UCNs, a number of which is greater than or equal to a threshold value, among the search target variable nodes.

10. The error correction circuit of claim 9, wherein the greater a degree of the variable node, the greater the threshold value.

11. The error correction circuit of claim 9, wherein the greater an iteration number, the smaller the threshold value.

12. The error correction circuit of claim 8, wherein the variable node value corrector selects variable nodes with a degree of a predetermined value or greater, among the variable nodes, as the search target variable nodes.

13. The error correction circuit of claim 8, wherein the variable node value corrector selects, as the search target variable nodes, a predetermined number of variable nodes in a direction where an index increases, starting from a variable node having a smallest index, among the variable nodes, or selects, as the search target variable nodes, a predetermined number of variable nodes in a direction where the index decreases, starting from a variable node having a largest index, among the variable nodes.

14. The error correction circuit of claim 8, wherein the variable node value corrector inverts values of search target variable nodes coupled to a largest number of UCNs, among the search target variable nodes.

15. The error correction circuit of claim 8, wherein the UCN number information manager increases a number of UCNs corresponding to a search target variable node by one, wherein a sign of a value of the search target variable node in the iteration in which the trapping set is detected does not coincide with a sign of an initial value, among the search target variable nodes.

* * * * *

UNITED STATES PATENT AND TRADEMARK OFFICE
CERTIFICATE OF CORRECTION

PATENT NO. : 10,790,859 B2  
APPLICATION NO. : 16/366944  
DATED : September 29, 2020  
INVENTOR(S) : Jang Seob Kim Page 1 of 1

It is certified that error appears in the above-identified patent and that said Letters Patent is hereby corrected as shown below:

On the Title Page

• Item (73), in Column 1, for "Assignee", delete "SKY hynix Inc." and insert -- SK hynix Inc. --, therefor.

Signed and Sealed this  
Twenty-fourth Day of November, 2020

Andrei Iancu  
*Director of the United States Patent and Trademark Office*